(12) United States Patent
You

(10) Patent No.: US 7,042,797 B2
(45) Date of Patent: May 9, 2006

(54) X-ADDRESS EXTRACTOR AND METHOD FOR EXTRACTING X-ADDRESS IN MEMORY DEVICE

(75) Inventor: Min Young You, Chungcheongbuk-do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/878,443

(22) Filed: Jun. 28, 2004

(65) Prior Publication Data
US 2005/0128856 A1    Jun. 16, 2005

(30) Foreign Application Priority Data
Dec. 15, 2003   (KR) .................. 10-2003-0091673

(51) Int. Cl.
*G11C 8/00* (2006.01)
(52) U.S. Cl. .................. 365/230.06; 365/189.05; 365/191; 365/194; 365/230.08
(58) Field of Classification Search .......... 365/230.06, 365/230.01, 230.08, 189.05, 189.12, 194, 365/191
See application file for complete search history.

(56) References Cited

U.S. PATENT DOCUMENTS 6,636,444 B1 * 10/2003 Uchida et al. ......... 365/189.05

* cited by examiner

*Primary Examiner*—Richard Elms
*Assistant Examiner*—Pho M. Luu
(74) *Attorney, Agent, or Firm*—Marshall, Gerstein & Borun LLP

(57) ABSTRACT

An X-address extractor includes a selection signal generator generating a selection signal in response to a command signal, a delayer for outputting a delayed selection signal by delaying the selection signal, a latch for outputting a delayed address signal by delaying the inputted address signal in response to the delayed selection signal and an X-address switch for outputting the X-address signal by transferring the delayed address signal only when the selection signal is in a first logic value.

15 Claims, 5 Drawing Sheets

X-ADDRESS EXTRACTOR AND METHOD FOR EXTRACTING X-ADDRESS IN MEMORY DEVICE

This application relies for priority upon Korean Patent Application No. 2003-0091673 filed on Dec. 15, 2003, the contents of which are herein incorporated by reference in their entirety.

BACKGROUND

1. Field of the Invention

The present invention relates to a memory such as a DRAM (dynamic random access memory), and particularly to an X-address extractor and a method for extracting X-address from address signal in a memory adaptable to a high speed operation.

2. Discussion of Related Art

A DRAM receives an X-address and Y-address through an address line. The X-address is input through a command line when an active command is input to the DRAM, and the Y-address is input when a read/write command is input to the DRAM. The X-address extractor performs a function of extracting the X-address among the X and Y addresses transferred through the address line.

Hereinafter, a conventional X-address extractor will be described with reference to FIGS. 1 and 2.

FIG. 1 is a block diagram of an X-address extractor according to the prior art. In FIG. 1, the X-address extractor includes a selection signal generator 110 and an X-address switch 120.

The selection signal generator 110 receives a command signal CMD and then outputs a selection signal SEL. The selection signal SEL retains logic '1' when the command signal CMD is being active, while retains logic '0' in the other periods.

The X-address switch 120 inputs an address signal ADD and the selection signal SEL and then outputs an X-address signal XADD. When the selection signal SEL is logic '1', the X-address signal XADD is outputted from the address signal ADD. When the selection signal SEL is logic '0', the address signal ADD retains its previous value.

By such an operation, the X-address extractor extracts the X-address signal XADD from the address signal ADD. However, as illustrated in FIG. 2, there is a problem that the X-address signal XADD has a different value not the X-address when the selection signal SEL changes to logic '0' from logic '1' after the address signal ADD changes to another value from an X-address value. Such a problem should be overcome because it occurs very frequently when the X-address is shortly held in the address signal ADD as a DRAM is improved in a higher speed or when the selection signal SEL is generated later due to the complexity of circuits.

SUMMARY OF THE INVENTION

Therefore, the present invention is directed to solve the aforementioned problem, providing an X-address extractor and a method for extracting X-address in a memory, by which an X-address signal has a value of the X-address even when the selection signal changes to logic '0' from logic '1' after an address signal changes to another value from an X-address.

In order to accomplish the object, a first aspect of the present invention provides an apparatus for extracting a X-address signal from an inputted address signal, including: a selection signal generation unit for generating a selection signal in response to a command signal; a delay unit for outputting a delayed selection signal by delaying the selection signal; a latch unit for outputting a delayed address signal by delaying the inputted address signal in response to the delayed selection signal; and a switch unit for outputting the X-address signal by transferring the delayed address only when the selection signal is in a first logic value.

A second aspect of the present invention provides an address extractor for obtaining an output address signal in response to a command signal and an input address signal, including: a first element for outputting an active logic value for a predetermined time when the command signal has a predetermined command value and for outputting an inactive logic value after the predetermined time; a second element for delaying an output signal of the first element; a third element for outputting the input address signal when an output signal of the second element is an inactive logic value and for outputting a previous output value when the output signal of the second element is an active logic value; and a fourth element for outputting an output signal of the third element as the output address signal when an output signal of the second element is an active logic value and for retaining a previous one of the output address signal when the output signal of the first element is an inactive logic value. The active logic value is one of logic '1' and '0' and the inactive logic value is the other of the logic '1' and '0'.

A third aspect of the present invention provides an address extractor for obtaining an output address signal in response to a command signal and an input address signal, including: a first element for outputting an active logic value for a predetermined time when the command signal has a predetermined command value and for outputting an inactive logic value for a period except the predetermined time; a second element for reversing and delaying an output signal of the first element; a third element for outputting the input address signal when an output signal of the second element is an active logic value and for outputting a previous output value when the output signal of the second element is an inactive logic value; and a fourth element for outputting an output signal of the third element as the output address signal when an output signal of the second element is an active logic value and for retaining a previous one of the output address signal when the output signal of the first element is an inactive logic value.

The active logic value is one of logic '1' and '0' and the inactive logic value is the other of the logic '1' and '0'.

A fourth aspect of the present invention provides an address extractor for obtaining an output address signal in response to a command signal and an input address signal, including: a first element for outputting a selection signal having a logic value variable in accordance with that the command signal is a predetermined command value; a second element for delaying the selection signal; a third element for operating the alternative of outputting the input address signal and retaining a previous output value in accordance with a logic value of an output signal of the second element; and a fourth element for operating the alternative of outputting an output signal of the third element as the output address signal and retaining a previous value of the output address signal in accordance with the logic value of the selection signal.

A fifth aspect of the present invention provides a memory including: a row address extractor according to one of the first through third aspects, for outputting a row address in response to an address signal and a command signal; a column address generator for creating a column address in response to the address signal and the command signal; a row decoder for selecting a row line in accordance with the row address; a column decoder for selecting a column line in accordance with the column address; and a memory cell array including plurality of memory cells which are readable or writable with data, being designated with a low line selected by the X-address signal and a column line selected by the Y-address signal.

A sixth aspect of the present invention provides a method for extracting an address, including the steps of: forming a delayed selection signal made from a selection signal that retains an active logic value for a predetermined time when an input command signal is an active command while retains an inactive logic value except the predetermined time; transferring an input address signal as a delayed address signal when the delayed selection signal is an inactive logic value and maintaining the delayed address signal on a previous value when the input address signal is an active logic value; transferring the delayed address signal as an output address signal when the selection signal is an active logic value and maintaining the output address signal on a previous value when the selection signal is the inactive logic value; and outputting the output address signal.

The active logic value is one of logic '1' and '0' and the inactive logic value is the other of the logic '1' and '0'.

A seventh aspect of the present invention provides a method for extracting an address, including the steps of: forming a delayed selection signal reversed from a selection signal that retains an active logic value for a predetermined time when an input command signal is an active command while retains an inactive logic value except the predetermined time; transferring an input address signal as a delayed address signal when the delayed selection signal is an active logic value and maintaining the delayed address signal on a previous value when the input address signal is an inactive logic value; transferring the delayed address signal as an output address signal when the selection signal is an active logic value and maintaining the output address signal on a previous value when the selection signal is the inactive logic value; and outputting the output address signal.

The active logic value is one of logic '1' and '0' and the inactive logic value is the other of the logic '1' and '0'.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Figure 1:
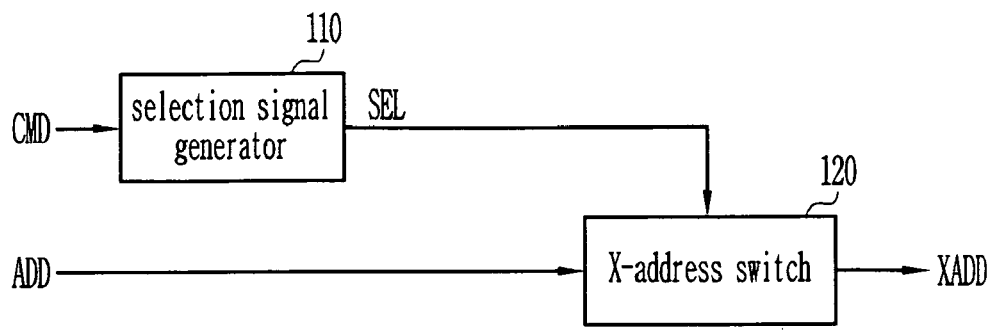
FIG. 1 is a block diagram of an X-address abstractor according to a conventional art.
Figure 2:
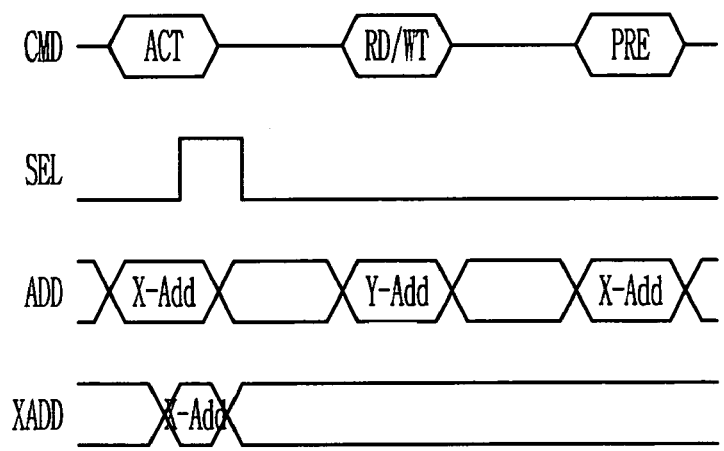
FIG. 2 is a timing diagram of the X-address abstractor according to a conventional art.

Referring now to the drawings wherein like or similar elements are designated with identical reference numerals throughout the several views and wherein various elements depicted are not necessarily drawn to scale. It should be understood that the description of the preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

Figure 3:
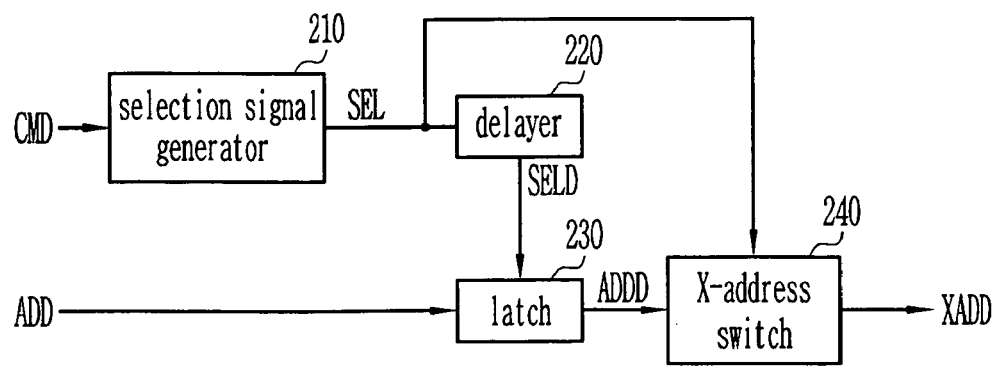
FIG. 3 is a block diagram of an X-address extractor according to an embodiment of the present invention.
Figure 4:
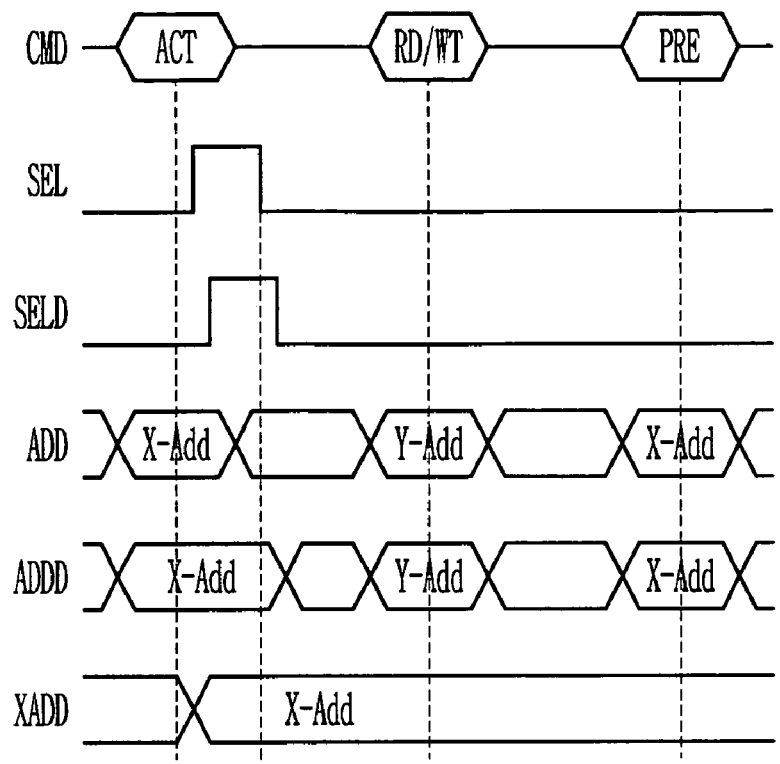
FIG. 4 is a timing diagram of the X-address extractor according to an embodiment of the present invention.

Hereinafter, it is described about an X-address extractor according to a first embodiment of the invention in conjunction with FIGS. 3 and 4. FIG. 3 is a block diagram of an X-address extractor according to an embodiment of the present invention, and FIG. 4 is a timing diagram of the X-address extractor according to an embodiment of the present invention.

In FIG. 3, the X-address extractor includes a selection signal generator 210, a delayer 220, a latch 230, and an X-address switch 240.

The selection signal generator 210 outputs a selection signal SEL in response to a command signal CMD. The selection signal SEL retains an active logic value for a predetermined period when the command signal CMD is in an active command, while retains an inactive logic value for the other period. The command signal CMD is recognized by a way of asynchronous detection that does not use a clock signal, or by another one of synchronous detection in which the active command is detected in synchronization with either a rising edge or a falling edge of a clock signal. The active logic value is one of logic '1' and '0', the inactive logic value is the complementary (or counterpart) of the active logic value. FIG. 4 illustrates a timing diagram of the command signal CMD and the selection signal SEL. In FIG. 4, the command signal CMD is operable in the asynchronous detection mode with the active logic value of logic '1' and the inactive logic value of logic '0'.

The delayer 220 outputs a delayed selection signal SELD in response to the selection signal SEL. The delayed selection signal SELD is a signal delayed from the selection signal SEL. A term maintaining the active logic value in the delayed selection signal SELD may be longer than that of the selection signal SEL. FIG. 4 shows the selection signal SEL and the delayed selection signal SELD when the selection signal SEL is converted into the delayed selection signal SELD delayed therefrom by a predetermined time.

The latch 230 receives an address signal ADD and the delayed selection signal SELD and then outputs a delayed address signal ADDD. If the delayed selection signal SELD is set on the inactive logic value, the delayed address signal ADDD has the value of the address signal ADD. If the delayed selection signal SELD is set on the active logic value, the delayed address signal ADDD retains its previous value. FIG. 4 depicts the states of the address signal ADD, the delayed selection signal SELD, and the delayed address signal ADDD when the active logic value of the delayed selection signal SELD is logic '1'.

The X-address switch 240 receives the delayed address signal ADDD and the selection signal SEL and then outputs an X-address signal XADD. If the selection signal SEL is set on the active logic value, the delayed address signal ADDD becomes the X-address signal XADD. If the selection signal SEL is set on the inactive logic value, the X-address signal XADD retains its previous value. FIG. 4 represents the states of the delayed address signal ADDD, the selection signal SEL, and the X-address signal XADD when the active logic value is logic '1'.

As illustrated in FIG. 4, the X-address extractor according to the first embodiment of the present invention normally operates even when the selection signal SEL changes to the inactive logic value from the active logic value after the address signal ADD changes from an X-address to another value. In other words, while in the conventional X-address extractor the X-address signal XADD has another value not an X-address in the case, the X-address extractor according to the first embodiment of the present invention makes enable the X-address signals XADD to have a normal X-address.

In FIG. 3, the delayer 220 may outputs a signal reversed from the delayed selection signal SELD in response to the selection signal SEL, which is permissible by modifying the operation of the latch. In this case, the delayed address signal ADDD has the value of the address signal ADD when the delayed selection signal SELD is the inactive logic value, while retains its previous value when the delayed selection signal SELD is the active logic value. Such a modified process can also obtain the result as aforementioned.

Hereinafter, it will be described about practical implementations of elements of the X-address extractor according to an embodiment of the present invention, in conjunction with FIGS. 5 through 9.

Figure 5:
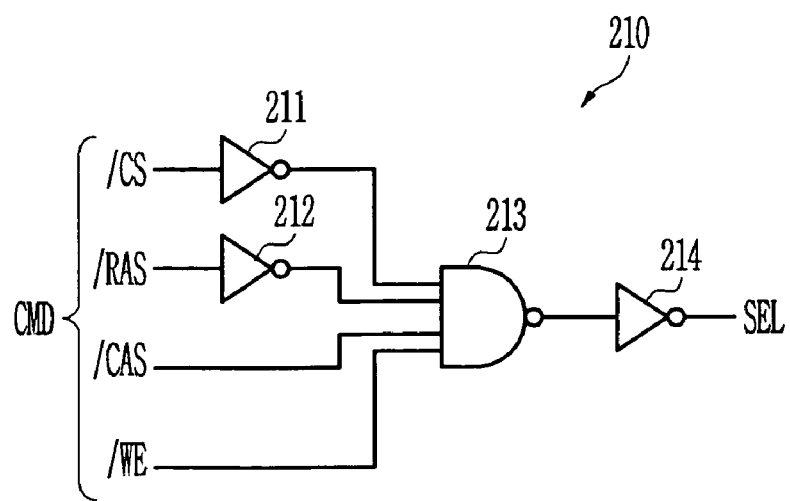
FIG. 5 is a circuit diagram of a selection signal generator according to an embodiment of the present invention.

FIG. 5 illustrates an implementation of the selection signal generator 210. Referring to FIG. 5, the selection signal generator 210 receives the command signal CMD formed of /CS, /RAS, /CAS, and /WE and outputs the selection signal SEL. The selection signal generator 210 includes three inverters 211, 212, and 214 and a 4-input NAND gate 213. If /CS='0', /RAS='0', /CAS='1', and /WE='1', the selection signal SEL becomes logic '1', i.e., the active logic value.

Figure 6:
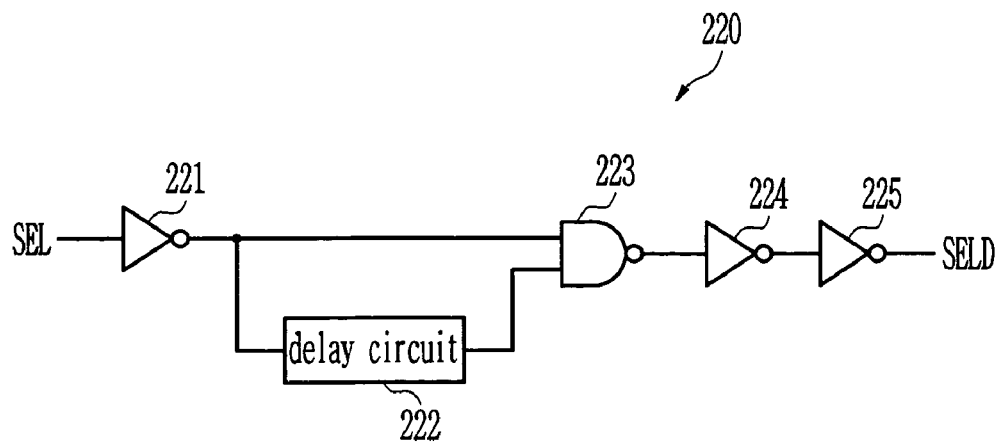
FIG. 6 is a circuit diagram of a delayer according to an embodiment of the present invention.

FIG. 6 is an illustration the delayer 220 according to an embodiment of the present invention. Referring to FIG. 6, the delayer 220 is formed of three inverters 221, 224, and 225, a NAND gate 223, and a delay circuit 222. The delay circuit 222 may be constructed of inverters connected in series. The selection signal SEL passes through the inverter 221, the delay circuit 222, and the NAND gate 223 to be a delayed signal with a wider time domain corresponding to the active logic value (e.g., logic '1'), and then generated as the delayed selection signal SELD having a higher drivability after passing through the two inverters 224 and 225. Without a need of enhancing the drivability, the delayer 220 may not include the two inverters 224 and 225.

Figure 7:
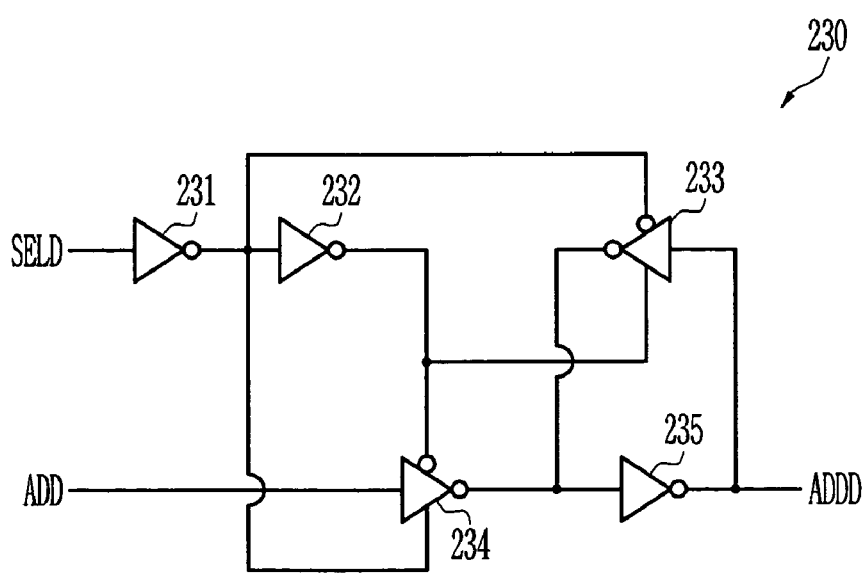
FIG. 7 is a circuit diagram of a latch according to an embodiment of the present invention.
Figure 8:
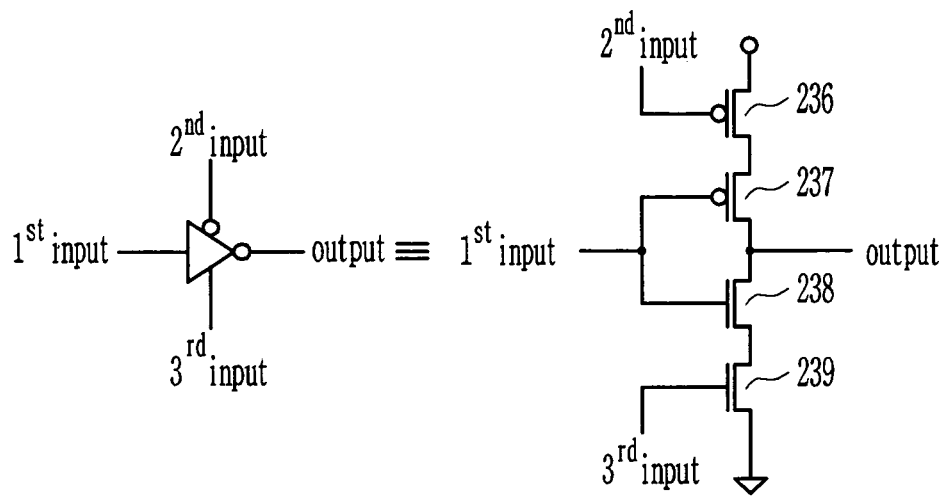
FIG. 8 is a circuit diagram of a switched inverter according to an embodiment of the present invention.

FIG. 7 illustrates an implementation of the latch 230 according to an embodiment of the present invention. Referring to FIG. 7, the latch 230 receives the delayed selection signal SELD and the address signal ADD and then outputs the delayed address signal ADDD. The latch 230 is composed of three inverters 231, 234, and 235, a first clocked inverter 233, and a second clocked inverter 234. An example of the clocked inverters 233 and 234 is illustrated in FIG. 8. Referring to FIG. 8, the clocked inverter is constructed of two PMOS transistors 236 and 237, and two NMOS transistors 238 and 239. In the clocked inverter, an output is a signal reversed from a first input when a second input is logic '0' and a third input is logic '1', or conditioned at a high impedance when the second input is logic '1' and the third input is logic '0'. In FIG. 7, if the delayed selection signal SELD is logic '0', the second clocked inverter 234 outputs a reversed address signal because the second input is logic '0' and the third input is logic '1'. The reversed address signal from the second clocked inverter 234 is converted to the delayed address signal ADDD after being reversed again. During this, an output of the first clocked inverter 233 is being on a high impedance state. If the delayed selection signal SELD is logic '1', the second clocked inverter 234 outputs a signal reversed from the delayed address signal ADDD because the second input is logic '0' and the third input is logic '1'. During this, as the output of the second clocked inverter 234 is a high impedance state, the delayed address signal ADDD retains its precious value. By the operation of the latch aforementioned, the delayed address signal ADDD becomes the address signal ADD when the selection signal SEL is logic '0' as the inactive logic value, while retains its previous value when the selection signal is logic '1' as the active logic value.

Figure 9:
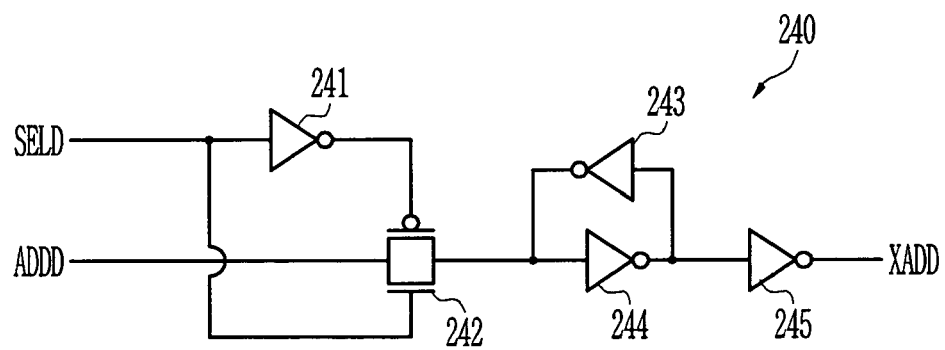
FIG. 9 is a circuit diagram of an X-address switch according to an embodiment of the present invention.

FIG. 9 is an implementation of the X-address switch 240 according to an embodiment of the present invention. Referring to FIG. 9, the X-address switch receives the selection signal SEL and the delayed address signal ADDD and then outputs the X-address signal XADD. The X-address switch 240 includes four inverters 241, 243, 244, and 245, and a pass transistor 242. The pass transistor 242 is configured with a PMOS transistor and an NMOS transistor. A source/drain of the PMOS transistor is connected to a source/drain of the NMOS transistor to act as a first source/drain of the pass transistor 242. The other source/drain of the PMOS transistor is connected to the other source/drain of the NMOS transistor to act as a second source/drain of the pass transistor 242. When the selection signal SEL becomes logic '1' of the active logic value, the pass transistor 242 is turned on to transfer the delayed address signal ADDD from the first source/drain to the second source/drain. The delayed address signal ADDD transferred to the second source/drain is converted to the X-address signal after passing through the two inverters 244 and 245. When the selection signal SEL becomes logic '0' of the inactive logic value, the pass transistor 242 is turned off to make the X-address signal XADD maintain its previous value by a pair of the inverters 243 and 244. By the operation of the X-address switch 240 aforementioned, the delayed address signal ADDD becomes the address signal ADD only when the selection signal SEL is logic '1' as the active logic value, while retains its previous value when the selection signal is logic '0' as the inactive logic value.

Figure 10:
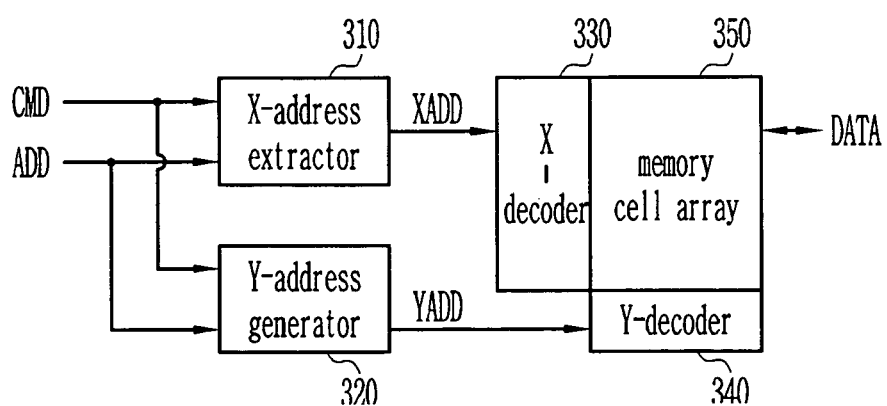
FIG. 10 illustrates a memory according to an embodiment of the present invention.

Hereinafter, it will be explained about a memory including the X-address extractor according to the embodiment of the invention, with reference to FIG. 10. FIG. 10 illustrates the memory embedding the present X-address extractor therein.

Referring to FIG. 10, the memory includes an X-address extractor 310 (as same as the described formerly), a Y-address generator 320, an X-decoder 330, a Y-decoder 340, a memory cell array 350. Here, the X-address denotes a row address and the Y-address denotes a column address. The X-address extractor 310 is that described and illustrated above according to this embodiment of the present invention. The Y-address generator 320 creates the Y-address in response to the command signal CMD and the address signal ADD. The X-decoder 330 selects a low line assigned to the X-address signal XADD and the Y-decoder 340 selects a column line assigned to the Y-address signal YADD. The memory cell array 350 has a plurality of memory cells which are readable or writable with data, being designated with a low line selected by the X-address signal and a column line selected by the Y-address signal.

With the operation in the memory, data is written into or read from a memory cell in accordance with the X-address signal XADD obtained by the X-address extractor 310 and the Y-address signal YADD provided by the Y-address generator 320.

Now, it will be described about a procedure of extracting an X-address according to this embodiment of the present invention.

Figure 11:
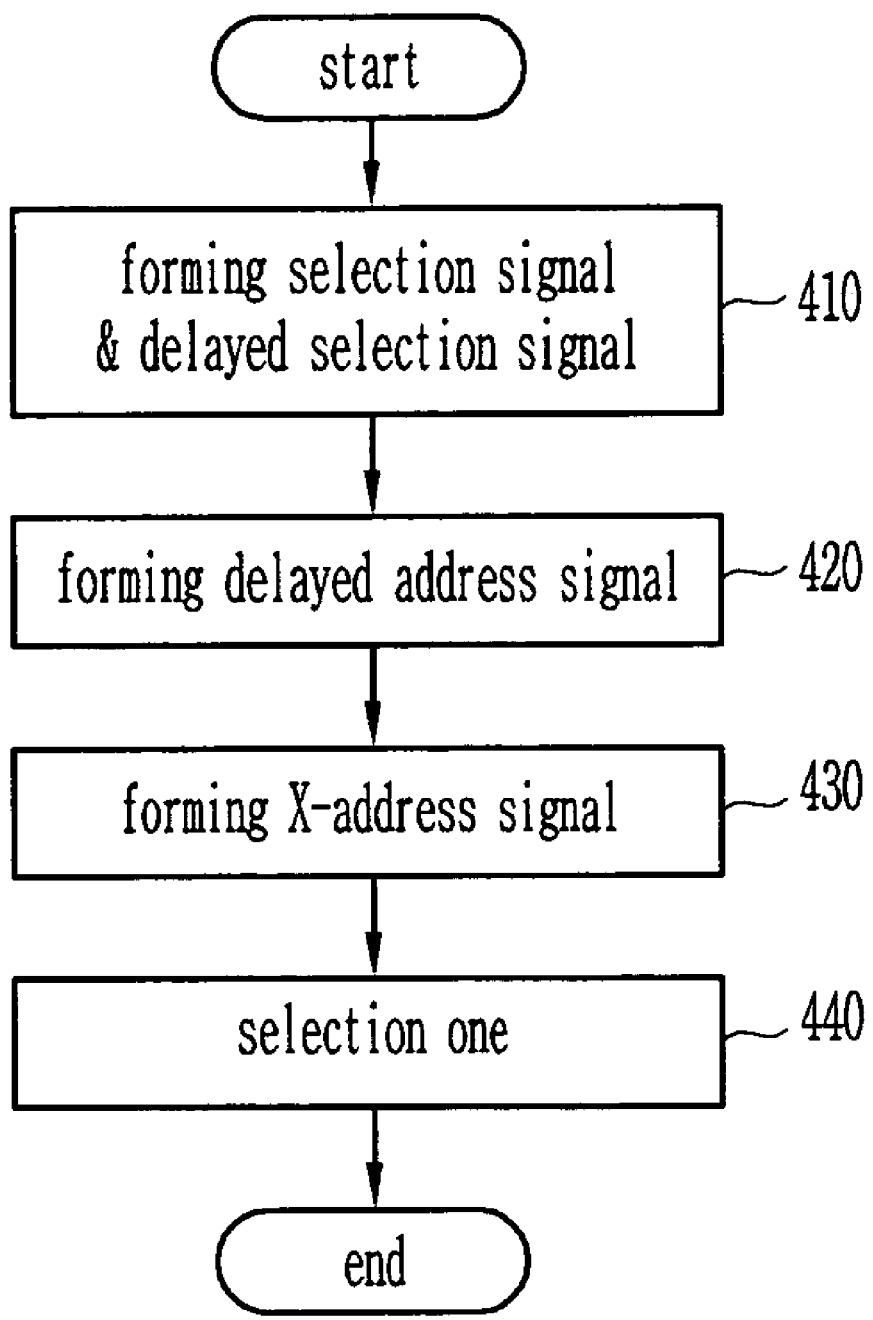
FIG. 11 is a flow chart illustrating an X-address extraction method in accordance with an embodiment of the present invention.

FIG. 11 is a flow chart illustrating the X-address extraction method.

Referring to FIG. 11, the present X-address extraction method includes a step 410 of forming the delayed selection signal made from the selection signal that retains the active logic value for a predetermined time when the command signal is an active command while retains the inactive logic value except the predetermined time, a step 420 of transferring a received address signal as the delayed address signal when the delayed selection signal is the inactive logic value and maintaining the delayed address signal on a previous value when the received address signal is the active logic value, a step 430 of transferring the delayed address signal as the X-address signal when the selection signal is the active logic value and maintaining the X-address signal on a previous value when the selection signal is the inactive logic value, and a step 440 of outputting the X-address signal.

Alternatively, the X-address extraction method shown in FIG. 1 may otherwise includes the step 410 of forming the reversed and delayed selection signal made from the selection signal that retains the active logic value for a predetermined time when the command signal is an active command while retains the inactive logic value except the predetermined time, the step 420 of transferring a received address signal as the delayed address signal when the delayed selection signal is the active logic value and maintaining the delayed address signal on a previous value when the received address signal is the inactive logic value, the step 430 of transferring the delayed address signal as the X-address signal when the selection signal is the active logic value and maintaining the X-address signal on a previous value when the selection signal is the inactive logic value, and the step 440 of outputting the X-address signal.

By the process in accordance with the X-address extraction method, it is possible to conduct a normal operation even when the selection signal changes to the inactive logic value from the active logic value after an address signal changes from an X-address to another value. In other words, nevertheless of the change of a received address signal to another value not an X-address, the X-address signal XADD keeps a value of the X-address.

As stated above, the X-address extractor, the X-address extraction method and the memory, according to the present invention provides an advantage of offering a normal operation even when the selection signal changes to logic '0' from logic '1' after an address signal changes from an X-address to another value.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. An apparatus for extracting a X-address signal from an inputted address signal, comprising:
   a selection signal generation unit for generating a selection signal in response to a command signal;
   a delay unit for outputting a delayed selection signal by delaying the selection signal;
   a latch unit for outputting a delayed address signal by delaying the inputted address signal in response to the delayed selection signal; and
   a switch unit for outputting the X-address signal by transferring the delayed address signal in response to the selection signal,
   wherein the switch unit outputs the X-address signal only when the selection signal is in a first logic value.

2. The apparatus of claim 1, wherein an output signal of the switch unit retains its previous value when the selection signal is converted to a second logic value.

3. The apparatus of claim 2, wherein the first logic value is logic '1' as an active logic value and the second logic value is logic '0' as an inactive logic value.

4. The address extractor of claim 1, wherein the fourth element comprises
   a first inverter, a second inverter, a third inverter, a fourth inverter, and a pass transistor,
   wherein an input terminal of the first inverter receives the output signal of the first element,
   wherein a first source/drain of the pass transistor receives the output signal of the third element, a PMOS gate of the pass transistor is connected to an output terminal of the first element, and an NMOS gate of the pass transistor receives the output signal of the first element,
   wherein an input terminal of the second inverter is connected to an output terminal of the third inverter,
   wherein a second source/drain of the pass transistor and an output terminal of the second inverter are connected to an input terminal of the third inverter,
   wherein an input terminal of the fourth inverter is connected to an output terminal of the third inverter; and
   wherein an output terminal of the fourth inverter outputs an output signal of the fourth element.

5. An address extractor for obtaining an output address signal in response to a command signal and an input address signal, comprising:
   a first element for outputting an active logic value for a predetermined time when the command signal has a predetermined command value and for outputting an inactive logic value after the predetermined time;
   a second element for delaying an output signal of the first element;
   a third element for outputting the input address signal when an output signal of the second element is an inactive logic value and for outputting a previous output value when the output signal of the second element is an active logic value; and
   a fourth element for outputting an output signal of the third element as the output address signal when an output signal of the second element is an active logic value and for retaining a previous one of the output address signal when the output signal of the first element is an inactive logic value; wherein the active logic value is one of logic '1' and '0' and the inactive logic value is the other of the logic '1' and '0'.

6. The address extractor of claim 5, wherein a period for which the output signal of the second element retains the active logic value is longer than a period for which the output signal of the first element retains the active logic value.

7. The address extractor of claim 5, wherein the second element comprises:
   a first inverter for receiving the output signal of the first element;
   a delay circuit for delaying an output signal of the first inverter by a predetermined time; and
   a NAND gate for outputting the output signal of the second element in response to the output signal of the first inverter and an output signal of the delay circuit.

8. The address extractor of claim 5, wherein the third element comprises a first inverter, a second inverter, a third inverter, a first clocked inverter, and second clocked inverter;
   wherein an input terminal of the first inverter receives the output signal of the second element;
   wherein an input terminal of the second inverter is connected to an output terminal of the first inverter;
   wherein a first input terminal of the first clocked inverter receives the input address signal, a second input terminal of the first clocked inverter is connected to an output terminal of the second inverter, and a third input terminal of the first clocked inverter is connected to the output terminal of the first inverter;
   wherein a first input terminal of the second clocked inverter is connected to an output terminal of the third inverter, a second input terminal of the second clocked inverter is connected to the output terminal of the first inverter, and a third input terminal of the second clocked inverter is connected to the output terminal of the second inverter;
   wherein an output terminal of the first clocked inverter and an output terminal of the second clocked inverter are connected to an input terminal of the third inverter; and
   wherein the output terminal of the third inverter outputs the output signal of the third element.

9. The address extractor of claim 8, wherein the clocked inverter comprises a first PMOS transistor, a second PMOS transistor, a first NMOS transistor, and a second NMOS transistor;
   wherein a first input is connected to a gate of the first PMOS transistor and a gate of the first NMOS transistor;
   wherein a second input is a gate of the second PMOS transistor;
   wherein a third input is connected to a gate of the second NMOS transistor;
   wherein an output is connected to a first source/drain of the first PMOS transistor and a first source/drain of the first NMOS transistor;
   wherein a second source/drain of the first PMOS transistor is connected to a first source/drain of the second PMOS transistor;
   wherein a second source/drain of the first NMOS transistor is a first source/drain of the second NMOS transistor;
   wherein a second source/drain of the second PMOS transistor is connected to a high voltage source; and
   wherein a second source/drain of the second NMOS transistor is connected to a low voltage source.

10. A memory comprising:
    a row address extractor as set forth in one of claims 1 through 4, for outputting a row address in response to an address signal and a command signal;
    a column address generator for creating a column address in response to the address signal and the command signal;
    a row decoder for selecting a row line in accordance with the row address;
    a column decoder for selecting a column line in accordance with the column address; and
    a memory cell array including plurality of memory cells which are readable or writable with data, being designated with a low line selected by the X-address signal and a column line selected by the Y-address signal.

11. An address extractor for obtaining an output address signal in response to a command signal and an input address signal, comprising:
    a first element for outputting an active logic value for a predetermined time when the command signal has a predetermined command value and for outputting an inactive logic value for a period except the predetermined time;
    a second element for reversing and delaying an output signal of the first element;
    a third element for outputting the input address signal when an output signal of the second element is an active logic value and for outputting a previous output value when the output signal of the second element is an inactive logic value; and
    a fourth element for outputting an output signal of the third element as the output address signal when an output signal of the second element is an active logic value and for retaining a previous one of the output address signal when the output signal of the first element is an inactive logic value; wherein the active logic value is one of logic '1' and '0' and the inactive logic value is the other of the logic '1' and '0'.

12. The address extractor of claim 11, wherein a period for which the output signal of the second element retains the inactive logic value is longer than a period for which the output signal of the first element retains the active logic value.

13. An address extractor for obtaining an output address signal in response to a command signal and an input address signal, comprising:
    a first element for outputting a selection signal having a logic value variable in accordance with that the command signal is a predetermined command value;
    a second element for delaying the selection signal;
    a third element for outputting the input address signal or retaining a previous output value, in accordance with a logic value of an output signal of the second element; and
    a fourth element for outputting an output signal of the third element as the output address signal or retaining a previous value of the output address signal, in accordance with the logic value of the selection signal.

14. A method for extracting an address, comprising the steps of:
    forming a delayed selection signal made from a selection signal that retains an active logic value for a predetermined time when an input command signal is an active command while retains an inactive logic value except the predetermined time;
    transferring an input address signal as a delayed address signal when the delayed selection signal is an inactive logic value and maintaining the delayed address signal on a previous value when the input address signal is an active logic value;

transferring the delayed address signal as an output address signal when the selection signal is an active logic value and maintaining the output address signal on a previous value when the selection signal is the inactive logic value; and outputting the output address signal, wherein the active logic value is one of logic '1' and '0' and the inactive logic value is the other of the logic '1' and '0'.

15. A method for extracting an address, comprising the steps of:

forming a delayed selection signal reversed from a selection signal that retains an active logic value for a predetermined time when an input command signal is an active command while retains an inactive logic value except the predetermined time;

transferring an input address signal as a delayed address signal when the delayed selection signal is an active logic value and maintaining the delayed address signal on a previous value when the input address signal is an inactive logic value;

transferring the delayed address signal as an output address signal when the selection signal is an active logic value and maintaining the output address signal on a previous value when the selection signal is the inactive logic value; and outputting the output address signal, wherein the active logic value is one of logic '1' and '0' and the inactive logic value is the other of the logic '1' and '0'.

* * * * *

UNITED STATES PATENT AND TRADEMARK OFFICE
CERTIFICATE OF CORRECTION

| | | |
|---|---|---|
| PATENT NO. | : 7,042,797 B2 | Page 1 of 1 |
| APPLICATION NO. | : 10/878443 | |
| DATED | : May 9, 2006 | |
| INVENTOR(S) | : Min Y. You | |

It is certified that error appears in the above-identified patent and that said Letters Patent is hereby corrected as shown below:

In the Claims:

Column 9, line 10, "delaying" should be -- dealing --.

Column 10, line 12, "including plurality" should be -- including a plurality --.

Signed and Sealed this

Ninth Day of January, 2007

JON W. DUDAS
*Director of the United States Patent and Trademark Office*